United States Patent [19]
Crisenza et al.

[11] Patent Number: 5,464,784
[45] Date of Patent: Nov. 7, 1995

[54] METHOD OF FABRICATING INTEGRATED DEVICES

[75] Inventors: Giuseppe Crisenza, Trezzo sull'Adda; Cesare Clementi, Busto Arsizio, both of Italy

[73] Assignee: SGS-Thomson Microelectronics s.r.l., Milano, Italy

[21] Appl. No.: 129,689

[22] Filed: Sep. 30, 1993

[30] Foreign Application Priority Data

Sep. 30, 1992 [EP] European Pat. Off. .............. 92830542

[51] Int. Cl.$^6$ ...................... H01L 21/8247; H01L 21/266
[52] U.S. Cl. .................. 437/43; 437/44; 437/52; 257/316; 257/326
[58] Field of Search ................. 437/43, 44, 909, 437/48, 49, 52; 257/315, 316, 326

[56] References Cited

U.S. PATENT DOCUMENTS

| | | | |
|---|---|---|---|
| 3,984,822 | 10/1976 | Simko et al. | 340/173 R |
| 4,780,431 | 10/1988 | Maggioni et al. | 437/52 |
| 4,808,544 | 2/1989 | Matsui | 437/44 |
| 4,997,777 | 3/1991 | Boivin | 437/38 |
| 5,034,791 | 7/1991 | Kameyama et al. | 357/23.9 |
| 5,053,849 | 10/1991 | Izawa et al. | 357/59 |
| 5,104,819 | 4/1992 | Frieberger et al. | 437/43 |
| 5,120,668 | 6/1992 | Hsu et al. | 437/41 |
| 5,175,119 | 12/1992 | Matsutani | 437/43 |
| 5,202,277 | 4/1993 | Kameyama et al. | 437/41 |

FOREIGN PATENT DOCUMENTS

| | | | |
|---|---|---|---|
| 0049392 | 4/1982 | European Pat. Off. | H01L 21/82 |
| 2673326 | 12/1991 | France | H01L 29/784 |
| 3813665 | 11/1988 | Germany | H01L 29/78 |
| 4105636.1 | 2/2291 | Germany | G11C 16/02 |
| 54-12565 | 1/1979 | Japan | H01L 21/265 |

OTHER PUBLICATIONS

J. E. Moon et al., *IEEE Electron Device Letters*, vol. 11, No. 5, pp. 221–223, "A New LDD Structure: Total Overlap With Polysilicon Spacer (TOPS)," May 1990.

T. Huang et al., *IEEE Electron Device Letters*, vol. EDL–8, No. 4, pp. 151–153, "A New LDD Transistor with Inverse–T Gate Structure," Apr. 1987.

D. S. Wen et al., International Electron Devices Meeting 1989, *Technical Digest*, pp. 765–768, "A Self-Aligned Inverse–T Gate Fully Overlapped LDD Device for Sub–Half Micron CMOS," Dec. 1989.

Primary Examiner—Olik Chaudhuri
Assistant Examiner—Richard A. Booth
Attorney, Agent, or Firm—David V. Carlson; Seed and Berry

[57] ABSTRACT

A method comprising the steps of depositing a first and second polysilicon layer, separated by an oxide layer; selectively etching the second polysilicon layer to form first gate regions; forming first substrate regions in the substrate and laterally in relation to the first gate regions; selectively etching the first polysilicon layer to form second gate regions of a length greater than the first gate regions; and forming in the substrate, laterally in relation to the second gate regions and partially overlapping the first substrate regions, second substrate regions of a higher doping level than the first substrate regions.

14 Claims, 3 Drawing Sheets

METHOD OF FABRICATING INTEGRATED DEVICES

TECHNICAL FIELD

The present invention relates to a method of fabricating integrated devices, and to the integrated device produced thereby.

RELATED APPLICATIONS

This application claims priority from European patent application No. 92830542.4 filed Sep. 30, 1992, which is incorporated herein by reference. This application is closely related to a U.S. application filed concurrently herewith Ser. No. 08/129,776 titled "Method of Fabricating Non-Volatile Memories and Non-Volatile Memory Produced Thereby" which related application claims priority from European patent application No. 92830541.6 filed on Sep. 30, 1992.

BACKGROUND OF THE INVENTION

In recent years, for integrated circuit transistors in general, a so-called ITLDD (Inverse T Low Doped Drain) structure has been devised, which has the advantage of withstanding the hot electron injection stress typical of submicrometer structures. For this reason, the ITLDD structure is among the most favoured for transistors with gate lengths below 0.5 micron but presents serious difficulties in terms of production and industrialization, as outlined below.

The first proposal for such a structure appeared in 1986 (cf. articles by HUANG T. Y. and others entitled "A novel submicron LDD transistor with inverse-T gate structure" IEEE-IEDM 1986, p. 742, and "A new LDD transistor with inverse-T gate structure" IEEE Electron Dev. Letters, 8, 1987, p. 151). These deal with a standard transistor in which the etching for defining the gate region is stopped at a certain level to give the desired structure, but not without obvious problems in terms of etching controllability and repeatability. So much so that, in the second of the above articles, alternative solutions are outlined for simplifying the etching stage, and, in a follow-up proposal, recourse is made by the same writer to two distinct gates, one wider and the other narrower, contacted by polysilicon spacers.

An alternative to the above process is described, for example, in an article by IZAWA R. and others entitled "Impact of the Gate-Drain Overlapped Device (GOLD) for deep submicrometer VLSI" IEEE Transactions Elect. Dev 35, 1988, p. 2088. According to this process, which was later to become widely used, a first thin polysilicon layer is deposited; a very thin layer of native oxide (5–10 Å) is grown by exposure to air; a second polysilicon layer is deposited on the oxide layer; the second polysilicon layer is etched highly selectively, so as to stop at the thin oxide layer; the low-doped regions are implanted through the native oxide layer, the first polysilicon layer and the gate oxide layer; and LPCVD (Low Pressure Chemical Vapour Deposition) oxide layer is deposited and etched to define the lateral spacers; the first thin polysilicon layer is etched; partial lateral re-oxidation of the thin polysilicon layer is effected; and the high-doped regions are implanted. In this way, overlapping of the transistor gate region and the low-doped regions does not depend on the size of the spacers.

The above known process is especially critical as regards selective etching of the second polysilicon layer, which requires extremely selective technology (100 to 1 is the figure mentioned) for selecting between the polysilicon and oxide, if the etching process is to be repeatable uniformly on a silicon wafer. What is more, no direct contact exists between the gate region parts separated by the native oxide layer, which, albeit thin, could impair electrical continuity. Finally, precise control of the lateral oxidation length of a doped polysilicon layer is not as straightforward as it would at first appear.

To overcome the above drawbacks, further processes have been proposed, such as that described in an article by PFIESTER J. and others entitled "A self-aligned LDD/channel implanted ITLDD process with selectively-deposited poly gates for CMOS VLSI" IEEE-IEDM, 1989, p. 253). This consists in forming the gate regions inside openings in an appropriate oxide layer over the first polysilicon layer; removing the oxide layer; implanting the low-doped regions; forming oxide spacers; and implanting the high-doped regions.

The process described in an article by MOON J. E. and others entitled "A new LDD structure: Total Overlap with polysilicon Spacer (TOPS)" IEEE Electron Dev. Letters, 11, 1990, p. 221, consists in forming appropriately thick polysilicon spacers for electrically contacting the top part of the gate region, formed from a thick polysilicon layer, and the bottom part of the gate region, formed from a thin polysilicon layer and separated from the first by an oxide layer. In this case, the low-doped regions are implanted through the oxide and thin polysilicon layers prior to forming the spacers, and the high-doped regions are implanted after they are formed.

In the process described in an article by WEN D. S. and others entitled "A self-aligned inverse T fully overlapped LDD device for sub-half micron CMOS" IEEE-IEDM, 1989, p. 765, the problem of contacting the two parts of the gate region is solved by depositing a thin polysilicon layer after defining the thicker part of the gate region and before defining the oxide for the spacers, which obviously complicates the process by introducing additional deposits and etching. In this case also, a dummy oxide or TiN layer is used for arresting etching of the polysilicon in the thicker part of the gate region, thus resulting in selectivity problems, especially when overetching.

Other processes proposed for fully overlapping the gate region and low-doped regions (cf. the article by HORI T. and others entitled "A new submicron MOSFET with LSTID (Large-tilt angle implanted drain) structure" Int. Symp. VLSI Technology Dig. 1988, p. 15) consist in implanting the above regions by sharply tilting the beam and semiconductor wafer. Such a technique presents difficulties in controlling the junction profile, and, what is more, results in direct injection of the charge into the gate oxide.

All the above processes (and others not mentioned) have met with only a limited amount of success, due to the manufacturing difficulties involved, and at any rate are limited in scope to integrated circuit transistors in general.

Undoubtedly, an inverse-T profile as proposed is disadvantageous as regards capacitive coupling of the gate and drain regions, and detrimental to the speed of the device. Nevertheless, analysis of the structure has shown advantage are to be afforded by using such a profile for the gate region. Some of the above articles in fact show how optimizing dosage of the low-doped regions and overlap length may minimize the above drawback and so limit the theoretical coupling increase to 10%, the consequences of which are further reduced by virtue of a big improvement in the source and drain series resistance values.

SUMMARY OF THE INVENTION

It is an object of the present invention to provide an improved method of fabricating integrated devices, based on the principle of partially overlapping the gate region on low-doped regions with an LDD type structure; which method provides for eliminating the drawbacks typically associated with known methods, for enabling troublefree, low-cost implementation, and for ensuring the production of high-performance devices.

According to the present invention, there are provided a fabrication process and device as claimed herein, the invention being by the claims and not limited to the preferred embodiment.

BRIEF DESCRIPTION OF THE DRAWINGS

A preferred non-limiting embodiment of the present invention, relative to the fabrication of a non-volatile memory, will be described with reference to the accompanying drawings, in which.

DETAILED DESCRIPTION OF THE INVENTION

The accompanying drawings show intermediate structures formed using the method according to the present invention, and relative to an EPROM memory and a pair of CMOS transistors, each integrated in a respective tub according to the twin tub process.

Figure 1:
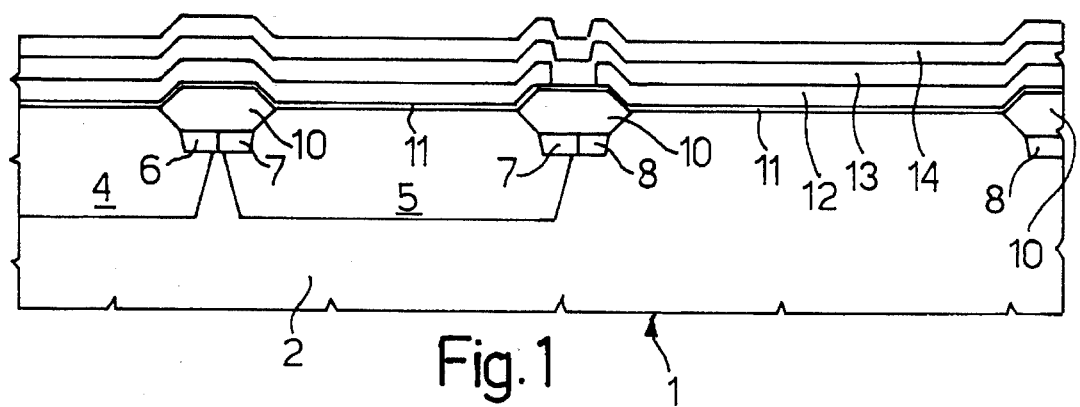
FIGS. 1 to 6 show cross sections of wafer of semiconductor material at various stages in the method according the present invention.

As shown in FIG. 1, the method commences with a silicon wafer 1 including a substrate 2 having twin tubs 4 and 5 of opposite conductivity, for housing respective circuit MOS transistors such as those in the peripheral circuit, as one example. The active areas are defined on wafer 1 using standard masking processes (the relative mask is shown by continuous line 3 in FIG. 7, which shows, one on top of the other, the various masks employed in the method described herein for one of the circuit transistors), and isolation regions 6, 7, 8 of appropriate conductivity are implanted between the active areas. The field oxide is then grown (to form regions 10), and an N type implant made in the memory cell area (right half of FIG. 1). Sacrificial oxidation is then effected, in known manner, on the active areas, and, following removal of the oxide layer so formed, gate oxide 11 (FIG. 1) is grown thermally. On top of gate oxide 11, a layer of polycrystalline silicon (first poly 12), appropriately doped to improve conductivity, is grown and then shaped by means of standard masking and etching operations, so as to produce, in the memory cell area, polysilicon strips extending parallel to strip 12 in FIG. 1 and in a plane perpendicular to that of the drawing.

On top of first poly 12, a layer of dielectric material (dielectric interpoly 13) is formed, and a suitably thick second polysilicon layer (second poly 14) is deposited for protecting dielectric layer 13, and so producing the intermediate structure shown in FIG. 1.

An array mask is then deposited, so that a suitably shaped resist layer 16 covers the whole of polysilicon layer 14 in the memory cell area, and the active areas in the circuitry area.

Figure 2:
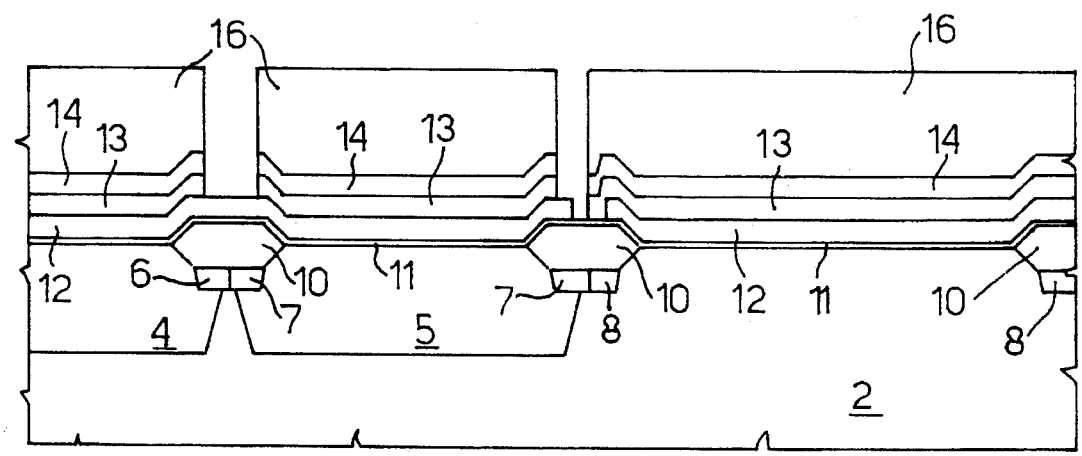
Figure 7:
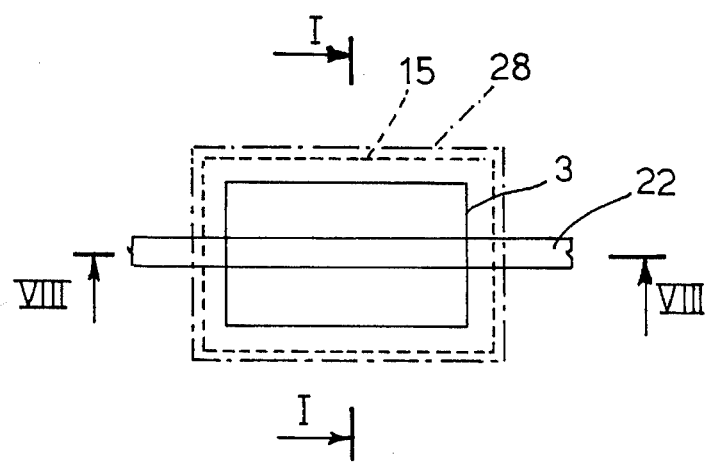
FIG. 7 shows a schematic view of the masks employed for the memory circuit transistors.

The design of the photolithographic mask at this stage differs as compared with that of standard processes, and, for a circuit transistor, is as shown by dotted line 15 in FIG. 7. The portions of polysilicon layer 14 and dielectric layer 13 not covered by resist layer 16 are then removed by plasma etching, to give the intermediate structure shown in FIG. 2.

Figure 3:
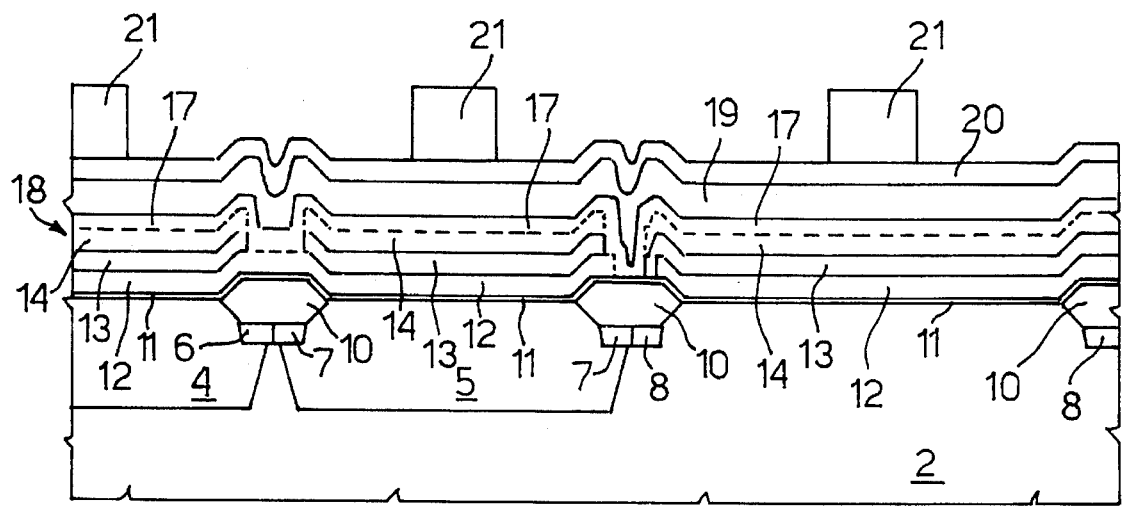

Following removal of resist layer 16, a threshold adjusting implant is made in the circuit transistor active area outside the memory cell array, and a third polycrystalline silicon layer 17 (FIG. 3) is deposited. Layer 17 is physically deposited onto the exposed areas and thus is in direct electrical contact with first poly layer 12 where second poly 14 and dielectric layer 13 have been removed (over field oxide regions 10 surrounding each circuit transistor, as shown also in the FIG. 8 section), and elsewhere is in direct electrical contact with second poly layer 14 (over the active areas of the circuitry and in the memory cell area) according to a selected masking pattern. Hereinafter, the layer resulting from overlapping layers 14 and 17 will be referred to a layer 18, since it does in fact act as a single layer. The top layer 17 is then appropriately doped to improve conductivity.

In summary, where it is desired to form a floating gate, the poly layer 17 contacts the second poly layer 14 but does not contact the first poly layer 12. Second poly layer 14 and first poly layer 12 remain electrically insulated from each other. On the other hand, where it is desirable to form a standard MOS transistor with first poly 12 as the gate of standard MOS transistor, the masking pattern is selected to expose both poly layers 12 and 14 when poly layer 17 is deposited such that poly layers 12 and 14 are physically connected via layer 17 and are electrically short circuited together. The transistors that are selected to be shorted together include circuit transistors is the peripheral circuitry and other circuit transistors on the chip as the circuit designs may select.

A 2500 Å thick silicide layer 19 ($WSi_2$) is then deposited and, over this, an LPCVD silicon oxide layer 20. The LPCVD silicon oxide layer 20 is not present in prior art processes and the etching of it is thus not necessary in these prior art processes. A suitably shaped photoresist layer is then deposited for defining the memory cell control gates and the circuit transistor gate regions, and so producing the structure shown in FIG. 3, which also shows resist layer 21 after shaping. The relative mask is also shown by continuous line 22 in FIG. 7.

Figure 4:
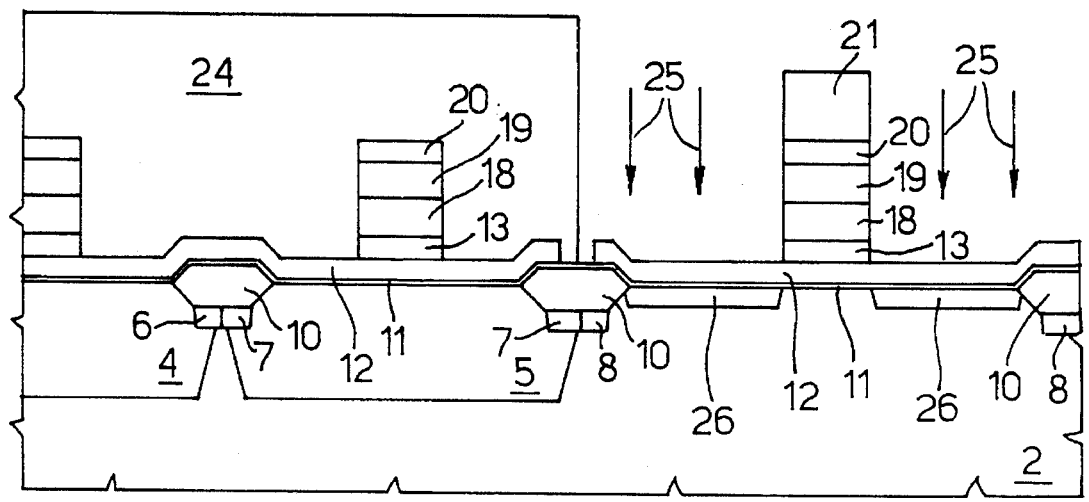

At this point, oxide layer 20, silicide layer 19, polysilicon layer 17 and layer 14 (if any) are plasma etched down to dielectric layer 13, which thus acts as a gate etching stop layer when defining the gate. Using the same mask, dielectric layer 13 is then etched by means of a further, polysilicon-selective, etching operation; a further resist mask 24 (FIG. 4) is deposited over mask 21, so as to leave only the memory cells exposed; and N type doping ions (e.g., a 7E13 at/$cm^2$ dose of phosphorous at 80 KeV) are implanted through first polysilicon layer 12 and gate oxide layer 11, as shown by arrows 25 in FIG. 4, so as to form, in the cell area of substrate 2, low-doped regions 26 aligned with the shaped stack formed by layers 13, 18, 19, 20, and so produce the intermediate structure shown in FIG. 4.

Following removal of the double resist layer 21, 24, a further resist layer is deposited and selectively etched with a masking pattern (not shown in FIGS. 1–6 but the shape of which, for a single transistor, is shown by dot-and-dash line 28 in FIG. 7) for implanting N type doping ions through first polysilicon layer 12 in the N channel transistor active areas of the circuitry as selected. At this stage, a 6E13 at/$cm^2$ dose of phosphorous at 110 KeV is typically employed, for producing regions 29 in tubs 5 (FIG. 5).

Following removal of the above mask, a further mask layer (of the same shape as mask 28) is deposited for implanting P type doping ions through first polysilicon layer 12 in the P channel transistor active areas of the peripheral circuitry. At this stage, a 3.5E13 at/cm$^2$ dose of boron at 45 KeV is typically implanted, for producing regions 30 in tubs 4 (FIG. 5).

Figure 5:
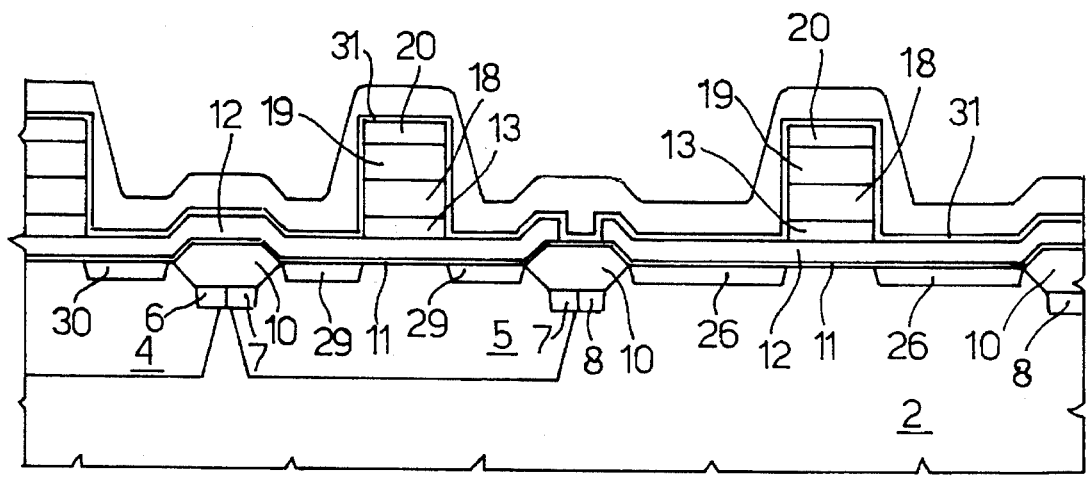

Following removal of the above mask, the overlapping layers in the stack are re-oxidized laterally in a controlled atmosphere to form a thin oxide layer 31 (FIG. 5); and an LPCVD silicon oxide layer 32 is deposited, to produce the intermediate structure shown in FIG. 5.

Oxide layer 32 is plasma etched immediately to form lateral spacers 33 (FIG. 6) to the side of stacked silicide and polysilicon layers 19 and 18. The deposition and subsequent etching of the upper oxide layer 32 to form the described lateral spacers is one of novel features contributed by one embodiment of the present invention.

Figure 6:
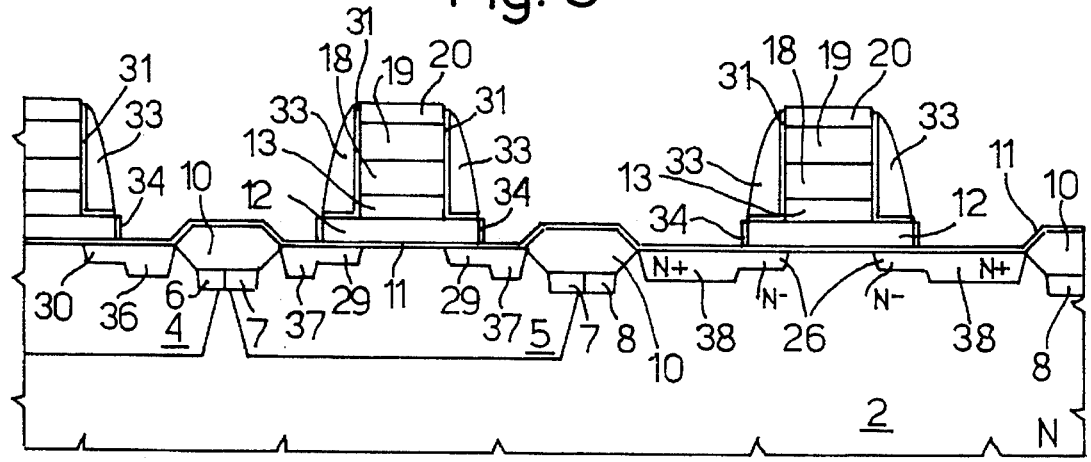
Figure 8:
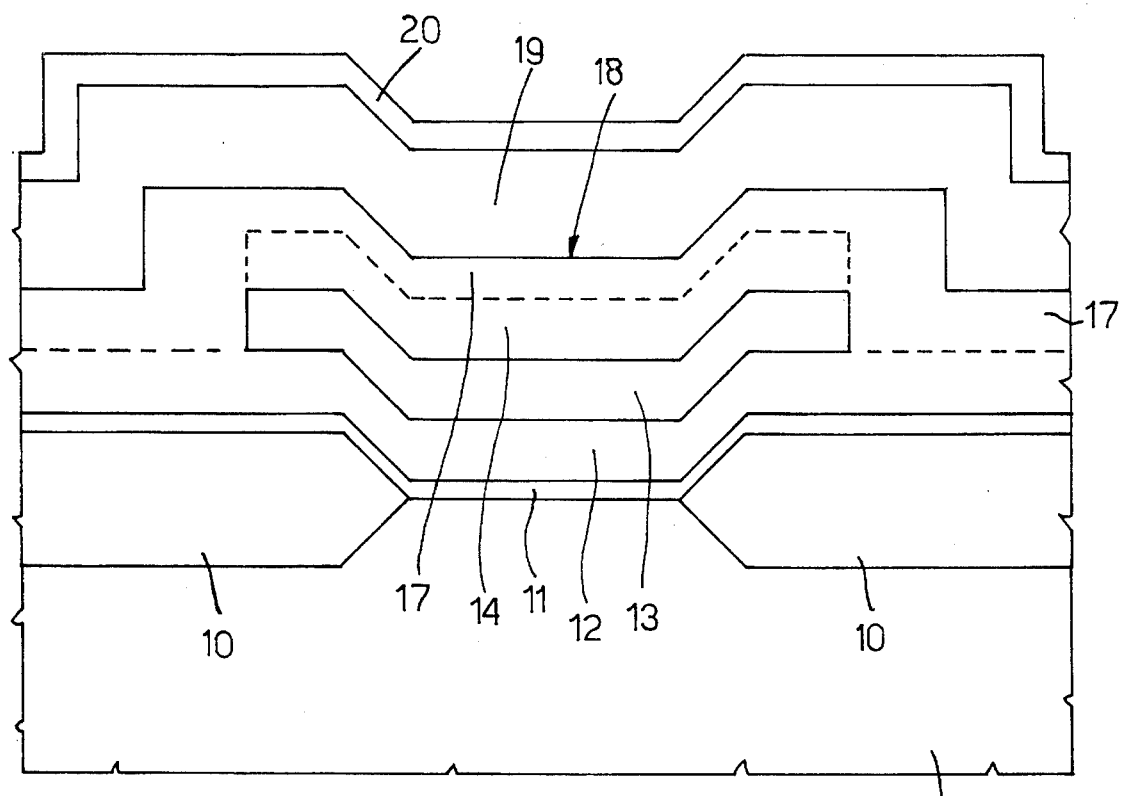
FIG. 8 shows a cross section of a circuit transistor, perpendicular to the FIG. 1–6 section.

By means of further plasma etching, first polysilicon layer 12 is then shaped so that, as shown in the FIG. 6 section, it is self-aligned with spacers 33, thus defining the floating gate of the memory cells (to the right in FIG. 6) and also the bottom part of the gate region of any transistor, which has previously been short circuited at the top part defined by layer 14 in regions on the chip up-and downstream from the FIG. 6 plane, as shown in FIG. 8.

Following minor protective re-oxidation (thin layers 34) of the lateral surface of layer 12 exposed by the above plasma etching surface of layer 12 exposed by the above plasma etching operation, appropriate masks (similar to 28) are deposited for making an N type and P type implant self-aligned with the gate regions formed by the remaining portions of layer 12, and so forming regions 36, 37, 38 (the first a P type and the other two N types) in tubs 4, tubs 5 and memory cell substrate 2, respectively. The resulting intermediate structure is as shown in FIG. 6. Transistors and cells similar in structure to known LDD (Light Doped Drain) devices are thus obtained, but in which, by virtue of the method employed, the bottom part of the gate region in the transistors and the floating gate in the cells partially overlap the low-doped regions.

The method then continues with the usual steps presently known in the art including: depositing a dielectric layer in which the contacts are defined; depositing and shaping a metal layer; and, finally, depositing a final passivation layer for externally insulating the memory.

The advantages of the method according to the present invention will be clear from the foregoing description. Firstly, by virtue of the ITLDD structure, it provides for producing transistors of improved performance, particularly as regards hot-carrier reliability, which is especially advantageous in the case of line decoding transistors subjected to high voltages.

Secondly, it provides for forming the memory cells in the same steps for forming circuit transistors and any other transistors on the chip that are not selected to be floating gate transistors by selectively utilizing a double short circuited poly concept on selected transistor structures. Thus enabling, as far as peripheral circuit transistors are concerned, low-cost production of devices otherwise involving unusual or unfeasible manufacturing processes.

To those skilled in the art it will be clear that changes may be made to the method and device as described and illustrated herein without, however, departing from the scope of the present invention.

Finally, the method according to the present invention also applies not only to memory-integrated but also to integrated circuit transistors in general, thus eliminating the manufacturing and implementation drawbacks mentioned previously and typical of known processes.

According to one alternative embodiment, the first insulation layer is selectively etched to expose selected portions of the first polysilicon layer prior to the second polysilicon layer being deposited such that when the second polysilicon layer is deposited, it directly contacts the first polysilicon without the need for the third polysilicon layer to be deposited to form the electrical interconnect.

The third polysilicon layer is thus not necessary in this alternative embodiment.

To those skilled in the art it will be clear that the changes may be made to the method and device as described and illustrated herein without, however, departing from the scope of the present invention.

We claim:

1. A method of fabricating an integrated circuit that includes a plurality of non-volatile memory cells comprising the steps of:

forming a gate oxide layer on a substrate;

depositing a first polysilicon layer on top of said gate oxide;

forming a first layer of insulating material overlying said first polysilicon layer;

depositing a second layer of polysilicon overlying said first insulating layer;

etching a portion of said second polysilicon layer to form a first gate region having a first length in a first direction;

etching a portion of said first polysilicon layer to form a second gate region having a second length in said first direction, the second length being longer than said first length in said first direction, said first gate region overlying said second gate region;

etching said second polysilicon layer and said first layer of insulating material in portions of locations to expose first portions of said first polysilicon layer and said second polysilicon layer and to not expose other second portions of said first polysilicon layer; and depositing a third layer of polysilicon onto the exposed portions of the first and second polysilicon layers to provide a layer polysilicon physically connecting the first layer of polysilicon and the second layer of polysilicon at locations and doping the exposed polysilicon layer such that some regions of the second polysilicon layer that directly overlie the first polysilicon layer are electrically connected together to form a gate of a MOS transistor at the first regions but the first and second polysilicon layers being electrically insulated from each other at the second regions on the integrated circuit to form a gate structure having a floating gate and a control gate.

2. The method according to claim 1 further including:

forming a plurality of first doped regions having a first doping level in said substrate, said first doped regions including regions that are overlaid by said first polysilicon layer, and the first doped regions being formed by ion implanting a dopant into the substrate through said oxide and through said first polysilicon layer overlying the first doped regions only at those regions of the first polysilicon that is not overlaid by the second polysilicon layer and preventing ion implanting of dopants in the substrate region that is overlaid by both the first and second polysilicon layers by using a mask that is comprised of a plurality of stacked masking layers that include the second polysilicon layer as one of the layers in the stacked mask; and forming a plurality of second doped regions having a second doping level in said substrate, said second doped regions overlapping only a portion of said first doping regions and extending away from the substrate region overlaid by the first layer of polysilicon, said second doping level being greater than said first doping level.

3. The method according to claim 2, further including:

forming lateral sidewall spacers on the sidewall of the stacked masking layers that include the second polysilicon layer after the ion implanting step and prior to the etching of the first polysilicon layer.

4. A method of fabricating an integrated circuit that includes a plurality of non-volatile memory cells comprising the steps of:

forming a gate oxide layer on a substrate;

depositing a first polysilicon layer on top of said gate oxide;

forming a first layer of insulating material overlying said first polysilicon layer;

etching said first layer of insulating material to expose a portion of the first polysilicon layer at first regions and maintain the layer of insulation at second regions overlying the first polysilicon region;

depositing a second layer of polysilicon overlying said first insulating layer and physically contacting the exposed portions of the first polysilicon layer outside the active area of the transistors being formed thereby and being physically insulated from the first polysilicon layer at portions overlying gate regions of transistors;

etching a portion of said second polysilicon layer to form a first gate region having a first length in a first direction;

etching a portion of said first polysilicon layer to form a plurality of second gate regions having a second length in said first direction, the second length being longer than said first length in said first direction, said first gate region overlying said second gate region; and wherein said plurality of said second gate regions includes regions that are physically connected to the second polysilicon layer by having etched portions of the insulating layer and a plurality of the second gate regions that are electrically insulated from the second polysilicon layers.

5. The method according to claim 4 in which depositing of the second layer is carried out by the steps of:

depositing a third layer of polysilicon onto the exposed portions of the first and second polysilicon layers to provide a layer of polysilicon physically connecting the first layer of polysilicon and the second layer of polysilicon to each other at portions of locations; and doping the exposed polysilicon layer.

6. The method according to claim 4 in which the second layer of polysilicon is directly deposited onto portions of the first layer of polysilicon.

7. The method according to claim 4 in which a third layer of polysilicon is deposited simultaneously directly on top of all exposed portions of the second layer of polysilicon and all exposed portions of the first layer of polysilicon to form an interconnecting electrical layer.

8. The method according to claims 1, 4, or 5 in which all portions of the second polysilicon layer on the chip are exposed and none is covered with insulation such that when the third layer of polysilicon is deposited on top of all portions of the second polysilicon layer the second and third layers merge to form a single second layer.

9. A method of fabricating integrated devices in and on a substrate of semiconductor material, said method comprising steps of:

depositing a first polycrystalline silicon layer over said substrate;

depositing a layer of insulating material on said first polycrystalline silicon layer;

shaping said layer of insulating material for forming insulating portions of insulating material, having a width in a second direction perpendicular to a first direction;

depositing at least a second polycrystalline silicon layer on said layer of insulating material wherein said second polycrystalline silicon layer electrically contacts said first polycrystalline silicon layer at least at a portion of said second polycrystalline silicon layer extending from said insulating portions and in said second direction;

etching portions of said second polycrystalline silicon layer for forming first gate regions of a first length in said first direction;

forming, in said substrate and laterally in relation to said first gate regions, first substrate regions having a first doping level;

etching portions of said first polycrystalline silicon layer for forming second gate regions of a second length, greater than said first length, in said first direction; and forming, in said substrate, laterally in relation to said second gate regions, and partially overlapping said first substrate regions, second substrate regions having a second performing level, greater than said first doping level.

10. A method of claim 9 wherein said step of forming said first substrate regions comprises forming regions self-aligned with said first gate regions, and said step of forming said second substrate regions comprises forming regions self-aligned with said second gate regions.

11. A method of claims 9 or 10 wherein said step of etching portions of said second polycrystalline silicon layer is followed by the step of etching portions of said layer of insulating material, and said step of forming said first substrate regions is performed by doping ion implantation through said first polycrystalline silicon layer.

12. A method of claims 9 or 10 wherein said layer of insulating material is formed from dielectric material.

13. A method of claims 9 or 10 wherein said step of etching portions of said first polycrystalline silicon layer is preceded by the step of forming lateral spacers of insulating material on sides of said first gate regions mutually aligned in said first direction.

14. A method of claim 13 wherein said step of forming said spacers comprises the steps of depositing and etching portions of a second layer of insulating material.

* * * * *

UNITED STATES PATENT AND TRADEMARK OFFICE
CERTIFICATE OF CORRECTION

PATENT NO.    :   5,464,784
DATED         :   November 7, 1995
INVENTOR(S)   :   Crisenza et al.

It is certified that error appears in the above identified patent and that said Letters Patent is hereby corrected as shown below:

In column 7, claim 4, line 32, please delete "physically" and insert therefor --electrically--.
In column 7, line 35, "physically" should read --electrically--.

Signed and Sealed this

Fourth Day of June, 1996

Attest:

BRUCE LEHMAN

Attesting Officer       Commissioner of Patents and Trademarks